United States Patent [19]

Hasegawa et al.

[11] 3,816,140

[45] June 11, 1974

[54] LIGHT-SENSITIVE COMPOSITION CONTAINING KETONE-FORMALDEHYDE RESIN

[75] Inventors: Eiichi Hasegawa; Nobuo Tsuji, both of Kanagawa, Japan

[73] Assignee: Fuji Photo Film Co., Ltd., Kanagawa, Japan

[22] Filed: June 29, 1972

[21] Appl. No.: 267,712

[30] Foreign Application Priority Data

July 2, 1971 Japan ................................ 46-48682

[52] U.S. Cl. .................... 96/115 R, 96/33, 96/35.1, 96/36, 96/36.2, 96/36.3, 96/91 N

[51] Int. Cl. .......... G03c 1/70, G03f 7/10, G03f 7/08

[58] Field of Search .... 96/115 R, 35.1, 91 N, 115 P

[56] References Cited

UNITED STATES PATENTS 3,493,380 2/1970 Rauner et al. .................... 96/115 R

FOREIGN PATENTS OR APPLICATIONS 234,864 10/1969 U.S.S.R. ............................ 96/115 R 794,572 5/1958 Great Britain .................... 96/115 R

*Primary Examiner*—Charles L. Bowers, Jr.

*Attorney, Agent, or Firm*—Sughrue, Rothwell, Mion, Zinn & Macpeak

[57] ABSTRACT

An inexpensive light-sensitive composition suited for use in print wiring or zinc relief printing, comprising a mixture of a light sensitive resin material such as polyvinyl cinnamate, polyvinyl cinnamylidene acetate or a rubber, e.g., cyclized, with an organic azide, with a ketone-formaldehyde resin such as those obtained by the condensation of formaldehyde with an aliphatic, aromatic or cycloaliphatic ketone in the presence of an alkali is disclosed.

10 Claims, No Drawings

LIGHT-SENSITIVE COMPOSITION CONTAINING KETONE-FORMALDEHYDE RESIN

BACKGROUND OF THE INVENTION

1. Field of the Invention

The present invention relates to a light-sensitive composition comprising a mixture of a light-sensitive resin material selected from the group consisting of a cinnamic acid type resin, cinnamylidene acetate type resin and cyclized rubber, with a ketone-formaldehyde resin.

2. Description of the Prior Art

It is known in the art that polyvinyl cinnamate or derivatives thereof bearing various phenyl group substituents, polyvinyl cinnamylidene acetate and cyclized rubber exhibit characteristic light-sensitive properties.

Particular compounds of these types are disclosed in Japanese Patent Publication No. 1492/1963, U.S. Pat. Nos. 2,601,120; 3,257,664; 2,940,853 etc.

Of these, polyvinyl cinnamate is known to possess a superior characteristic light-sensitive property. For instance, it can be more highly sensitized by combination with a sensitizing agent to provide a clear and distinct picture image with a high resolving power as well as superior chemical resistance.

Taking advantage of such unique characteristics, polyvinyl cinnamate finds extensive utilities as a resist substance in the fields of print wiring, integrated circuit (IC), chemical milling, etc. However, the high cost of the polyvinyl cinnamate has thus far limited its practical utility. Although some improvements on its synthesis method have been proposed, the price is still fairly higher than ordinary synthetic high molecular weight materials. In order to overcome such a disadvantage, a proposal has been made to lower its cost by admixing it with a phenolic resin. (Jap. Pat. Pub. No. 8497/1970). It has been found, however, that the addition of a phenolic resins, in excess of 30 percent by weight, for example, according to the disclosure of said patent specification, Hitanol 2181S, manufactured by Hitachi Kasei Co., Ltd. when used as the phenol resin causes a significant loss in transparency.

It is therefore an object of this invention to provide an inexpensive light-sensitive composition without impairing the unique characteristics of polyvinyl cinnamate and like light-sensitive materials.

Extensive investigation to solve the above-desired problem were made with respect to the compatibility of vinyl cinnamate type resins with a variety of other thermoplastic high molecular weight materials, and it was found that good compatibility is not obtainable upon blending it with vinylic polymers such as acrylic acid, styrene, cellulosic derivatives such as cellulose nitrate and rubbery materials such as styrene-butadiene rubber.

SUMMARY OF THE INVENTION

It has been unexpectedly found, however, that a light-sensitive resin can be mixed uniformly with a ketone-formaldehyde resin even at a high mixing ratio without causing any degradation in its inherent characteristics. The present invention is achieved on the basis of the above new discovery.

With more particularity, the present invention relates to a light-sensitive composition comprising a light-sensitive resin selected from the group consisting of a cinnamic acid type resin, cinnamylidene acetate type resin and a natural, a synthetic or a cyclized rubber with an organic azide, and a ketone formaldehyde resin.

DETAILED DESCRIPTION OF THE INVENTION

The ketone-formaldehyde resin to be employed in accordance with the present invention includes a resin obtained by the condensation of a ketone with formaldehyde. This type of resin is known and is disclosed in a number of publications such as U.S. Pat. No. 2,540,885, *Chemical Abstracts* 48, 5549; *Mokuzai Kenkyu* 4, 50(1950), and can be prepared by adding dropwise an aqueous solution of an alkali such as sodium hydroxide to a mixture of a ketone and an aqueous formaldehyde solution. The reaction can be naturally carried out in a diluted state by the use of an inert solvent. The mixing ratio of the ketone to formaldehyde is usually about 1:1 to 1:3, preferably about 1:1.2 to 1:1.4. The average molecular weight of the resin is usually below 600, for example, to a molecular weight of 200. Ketones which can be used include, for example, aliphatic ketones such as acetone, methyl ethyl ketone, methyl isobutyl ketone, diethyl ketone, aromatic ketones such as acetophenone, and cyclic ketones such as cyclopentanone, cyclohexanone and ethyl phenyl ketone.

A typical method for the synthesis of a ketone-formaldehyde resin is illustrated below.

SYNTHESIS OF ACETONE-FORMALDEHYDE RESIN

A three-necked flask was charged with 2 mols of acetone and 2.4 mols of a 36 percent aqueous solution of formaldehyde, and continuously stirred to effect reaction while keeping the reaction temperature at 60°C under dropwise addition of a 30 percent aqueous solution of sodium hydroxide so as to render the pH to 8 until the odor of formaldehyde disappeared (6–7 hours). After removing the unreacted acetone and water under reduced pressure, the desired resin was obtained as a slightly yellow, clear and viscous liquid having a specific gravity of 1.253 and refractive index $n_D^{20}$=1.4850. Although the structural formula of this resin is not yet accurately determined, it is believed to be a mixture of various condensates of acetone with formaldehyde.

SYNTHESIS OF CYCLOHEXANONE-FORMALDEHYDE RESIN

To a liquid mixture comprising 100g of cyclohexanone, 63g of a 36 percent aqueous solution of formaldehyde and 100g of cyclohexane, a 20 percent aqueous solution of sodium hydroxide was gradually added dropwise. The reaction was continued for 7 hours while constantly adjusting the pH to 8. After completing the reaction, the excess solvent was removed under reduced pressure and water was added under agitation to thereby solidify and precipitate the resin so formed. The resin was thereafter dried to give the desired cyclohexanone-formaldehyde resin as slightly yellow crystals having a softening point of 95°–97°C and viscosity in toluene of 10 cps(20°C) at a 30 percent concentration. This resin is readily soluble to ketones, esters, tetrahydrofuran, acetonitrile, aromatic types of solvents etc. This resin is generally shown by the following structural formula

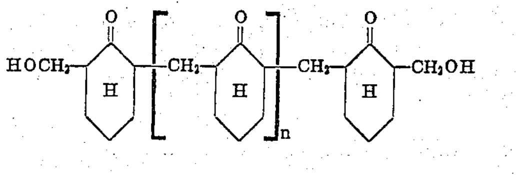

in which $n$ is an integer of usually not greater than 10. The methylol groups at the both terminal ends can be reacted further with other reactive compounds such as those containing amino groups, carboxyl groups, isocyanate groups etc. to give a socalled modified cyclohexanone-formaldehyde resin.

SYNTHESIS OF ACETOPHENONE-FORMALDEHYDE RESIN

To a solution of 30g(0.25 mol) of acetophenone in 100 ml. of ethanol, 4g (0.1 mol) of sodium hydroxide was added, then formaldehyde (36 percent aqueous solution) equivalent to 0.5 mol was gradually added thereto. The reaction was continued at 50°C for 6 hours by stirring the above mixture. After neutralization using sulfuric acid, ethanol and the excess formaldehyde was removed from the reacted mixture under reduced pressure to give a glass-like resin which exhibited no clear melting point but softened at 100°C and had an elementary analysis of C:75%, H:8%.

The cost of the ketone-formaldehyde resin is such that it is far less expensive than the cost of polyvinyl cinnamate. Therefore, a light-sensitive composition comprising these mixtures is extremely advantageous compared to that consisting solely of a polycinnamic acid type resin.

The light-sensitive resin composition of the present invention always retains good transparency not only as a solution containing the ketone-formaldehyde resin at a concentration as high as 50 percent by weight but also in the form of a film. Suitably, the light-sensitive composition can contain from about 5 to 50 wt. %, preferably from 20 to 40 wt. %, of the ketone-formaldehyde resin based on the total weight of the light-sensitive composition. Moreover, no reduction in the sensivity occurs in comparison with a composition solely of a cinnamic acid type resin. Furthermore, the resin composition of this invention exhibits rather superior adhesion to metals, plastic films, rubbers etc. which is much more desirable for use as a resist substance. In addition, since the ketone-formaldehyde resin has excellent resistance to chemicals a resist substance made of the light-sensitive resin composition of this invention is hardly attacked by chemicals even at a high mixing proportion, i.e., higher resin contents.

Any of the conventional sensitizers, for example, those disclosed in U.S. Pat. No. 3,257,664, for polyvinyl cinnamate type resins are suitable for use in this invention, e.g., at from 0.1 to 10% by weight, preferably at from 0.5 to 3 percent by weight, based on the weight of the light-sensitive resin. In addition, optical sensitizing dyes can also be employed in the light-sensitive composition of this invention. These additional materials can be present at a level of up to 10 percent by weight based on the weight of the light-sensitive resin.

Accordingly, the light-sensitive composition of the present invention possesses outstandingly excellent properties as a resist substance for use in preparing planographic or letterpress printing plates, in printed wiring, name plates, chemical milling, etc.

The ketone-formaldehyde resin of the present invention can be also mixed with other known light-sensitive resins than vinyl cinnamate and similar cinnamic acid type resins, such as polyvinyl cinnamate and polyvinyl cinnamylidene acetate, including those having various substituents on the phenyl group of the cinnamoyl group, for example, p-chlorophenyl and p-nitrophenyl, while attaining similar advantageous results. Examples of such other types of light-sensitive resins which can be admixed with the ketone-formaldehyde resin are those obtained by dissolving in an organic solvent natural rubbers, synthetic rubbers, cyclized rubbers, etc., together with an organic azide compound, and polyvinyl cinnamylidene acetate. Suitable organic azide compounds include 4,4′-diazidostilbene, p-azidobenzophenone, 4,4′-diazidochalcone, 2,6-di-(4′-azidobenzal)-cyclohexane, 2,6-di-(4′-azidobenzal)-4-methylcyclohexane and the like. These light-sensitive resins which can be used with the ketone-formaldehyde resin in this invention are disclosed in the above-described patents and in a number of other prior patents. Many of them are now commercially available.

The above-described light-sensitive compositions of this invention can be coated on a suitable supports such as metal plates, e.g., an aluminum plate, a zinc plate, a copper plate, or a plastic film, e.g., a polyethylene terephthalate film, a cellulose ester film such as cellulose acetate, cellulose diacetate, cellulose triacetate or cellulose acetate butyrate, a polyethylene film, a polystyrene film, a polycarbonate film, etc. Suitable coating amounts can vary depending on the end use desired and coating thicknesses of from 1 to 50$\mu$ are generally suitable.

The present invention will be further explained in greater detail by reference to the following examples:

EXAMPLE 1

A light-sensitive solution having the following composition was prepared.

| | | |
|---|---|---|
| Polyvinyl Cinnamate | 10 | g |
| 1,2-Benzanthraquinone | 0.1 | g |
| Trichloroethylene | 70 | ml. |
| Ethyl Cellosolve Acetate | 80 | ml. |

A portion of the above solution was dropped onto a copper base plate for use in printed wiring attached on a wheel rotating at the speed of 80 RPM so as to form a uniform coating thereon. The coated plate was dried at 70°C for 10 minutes to give a light sensitive layer with a thickness of 10 microns. The plate was exposed for 2 minutes with a xenon lamp (500W) under vacuum using a wiring pattern diagram as a negative image on a silver halide photographic element, then subjected to development with the use of trichloroethylene.

Meanwhile, three kinds of solutions were prepared by varying the proportion of the ketone-formaldehyde resin to the polyvinyl cinnamate, i.e., by adding the acetone-formaldehyde resin synthesized in accordance with the method described hereinbefore to the above composition, i.e., 1 g (9.1 percent), 3g (23 percent) and 5g (33 percent), respectively. The resins dissolved easily to give solutions having exactly the same transparency as that prepared without adding the acetone-formaldehyde resin. These solutions were coated on print wiring base plate and dried under the same conditions as described above. In this instance, every light-sensitive layer formed from each of the above three solutions remained transparent which indicates that a through and uniform mixing of the polyvinyl cinnamate with acetone-formaldehyde resin was attained.

Upon exposure and development of the light-sensitive layers so formed, the adhesion between the resultant copper base plate and the layer was found to become greater as the proportion of the ketone-formaldehyde resin in the composition increased and no stripping of the layer from the base plate due to swelling with trichloroethylene was observed.

The above four types of resists were etched with an aqueous ferric chloride solution at 40°C for 4 minutes, then dried and the resist layers were removed using ethylene dichloride to give printed wiring base plates. In this case, no defects were observed as to the samples to which the acetone-formaldehyde resin was added, and the removal of the resist layer could be carried out rather smoothly when the acetone-formaldehyde resin was added. The sensitivity of the resist at the addition of each 0, 9.1, 23 and 33 percent of the acetone-formaldehyde resin indicated the values of 8, 8, 8 and 7 respectively as measured using the grey scale step number. It is apparent from this result that no substantial influence on the sensitivity is observed by the addition of the acetone-formaldehyde resin. Although a drop of only one step occurred at the addition of 33 percent, this is obviously immaterial from a practical viewpoint.

This result also indicates that the admixing of the acetone-formaldehyde resin with the polyvinyl cinnamate provides an inexpensive light-sensitive composition unaccompanied by any deterioration in the performances desired.

EXAMPLE 2

The procedure of Example 1 was repeated using a cyclohexanone-formaldehyde resin prepared according to the previously described method instead of the acetone-formaldehyde resin. Similarly good results were obtained.

A light-sensitive liquid comprising polyvinyl cinnamate and the cyclohexanone-formaldehyde resin was spray-coated on a zinc plate for relief printing and dried to give a light-sensitive layer of a thickness of 30 microns. After tightly contacting a silver halide half-tone pattern diagram, it was exposed with a carbon arc lamp and developed using trichloroethylene. Etching treatment with nitric acid gave a desired relief printing plate.

EXAMPLE 3

A light-sensitive solution having the following composition was prepared.

| | | |
|---|---|---|
| Cyclized Rubber | 20 | g |
| Xylene | 200 | g |
| 4,4-Diazidostilbene | 0.8 | g |
| Cyclohexanone-Formaldehyde Resin | 20 | g |

This clear solution was coated on a copper base plate for print wiring and subjected to a procedure similar to that employed in Example 1 to give a brilliant print base plate.

EXAMPLE 4

A clear and uniform solution comprising 20 g of polyvinyl cinnamylidene acetate, 150 g of methyl cellosolve, 0.5 g of N-phenyl thioacrylidone and 15 g of acetone-formaldehyde resin was coated on a anodically-oxidized aluminum plate and dried at 60°C for 10 minutes. The light-sensitive layer so formed remained transparent at this point. It was then exposed with a carbon arc lamp using a half-tone negative film as an original pattern diagram, and developed with methyl cellosolve to give a lithographic printing plate having a clear photo-polymerized picture.

While the invention has been described in detail and in terms of specific embodiments thereof, it will be apparent that various changes and modifications can be made therein without departing from the spirit and scope thereof.

What is claimed is:

1. A light-sensitive composition comprising a ketone-formaldehyde resin and a light-sensitive resin selected from the group consisting of 1. polyvinyl cinnamate type resin,
2. polyvinyl cinnamylidene acetate resin and
3. natural rubber, synthetic rubber or a cyclized rubber and an organic azide.

2. The composition according to claim 1, in which said ketone-formaldehyde resin is an acetone-formaldehyde resin.

3. The composition according to claim 1, in which said ketone-formaldehyde resin is a cyclohexanone-formaldehyde resin.

4. The composition according to claim 1, in which said ketone-formaldehyde resin is an acetophenone-formaldehyde resin.

5. The composition of claim 1, in which said light sensitive resin is polyvinyl cinnamate.

6. The composition of claim 1, in which the light sensitive resin is polyvinyl cinnamylidene acetate.

7. The composition of claim 1, in which the light-sensitive resin is a cyclized rubber and an organic azide.

8. The composition of claim 1, in which the proportion of said ketone-formaldehyde resin is not greater than 50% by weight of said light-sensitive composition.

9. The composition of claim 1, wherein said composition additionally contains a sensitizer.

10. A light-sensitive element comprising a support having thereon a layer of the light-sensitive composition of claim 1.

* * * * *